(12) United States Patent
Fang et al.

(10) Patent No.: US 11,330,727 B2
(45) Date of Patent: May 10, 2022

(54) DISPLAY DEVICE (71) Applicant: BOE TECHNOLOGY GROUP CO., LTD., Beijing (CN)

(72) Inventors: Deli Fang, Beijing (CN); Tailiang Li, Beijing (CN); Shuo Chen, Beijing (CN); Ken Wen, Beijing (CN); Yongda Ma, Beijing (CN); Jian Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/054,236

(22) PCT Filed: Dec. 26, 2019

(86) PCT No.: PCT/CN2019/128637
§ 371 (c)(1),
(2) Date: Nov. 10, 2020

(87) PCT Pub. No.: WO2020/143462
PCT Pub. Date: Jul. 16, 2020

(65) Prior Publication Data
US 2021/0112671 A1  Apr. 15, 2021

(30) Foreign Application Priority Data
Jan. 8, 2019 (CN) .......................... 201920025071.5

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 7,259,810 | B2 * | 8/2007 | Kim ................. | G02F 1/133605 349/67 |
| 8,031,289 | B2 * | 10/2011 | Naritomi ........... | G02F 1/133608 349/58 |
| 9,137,914 | B2 * | 9/2015 | Takao ................. | H05K 5/0208 |
| 10,290,827 | B2 | 5/2019 | Katagiri et al. | |
| 2012/0162880 | A1 * | 6/2012 | Yoon ..................... | G02F 1/1339 361/679.01 |

FOREIGN PATENT DOCUMENTS

| | | | |
|---|---|---|---|
| CN | 203541896 U | 4/2014 | |
| CN | 207425244 U | 5/2018 | |

(Continued)

*Primary Examiner* — Hung S. Bui
(74) *Attorney, Agent, or Firm* — Scully Scott Murphy & Presser (57) ABSTRACT

A display device includes a frame, a display module is provided in the frame, a plurality of press sheets for fixing the display module are provided around the display module. Each press sheet is provided with a positioning part which limits a position of the press sheet in a direction parallel to a display surface of the display module.

19 Claims, 4 Drawing Sheets

(56) References Cited

FOREIGN PATENT DOCUMENTS

| | | |
|---|---|---|
| CN | 208400415 U | 1/2019 |
| CN | 209087286 U | 7/2019 |
| JP | H09-244545 A | 9/1997 |
| JP | 2001-337611 A | 12/2001 |
| JP | 2018-010158 A | 1/2018 |

* cited by examiner

DISPLAY DEVICE

CROSS-REFERENCE TO RELATED APPLICATIONS

This application is a national stage entry of PCT International Application No. PCT/CN2019/128637, filed on Dec. 26, 2019, which claims the benefit of Chinese Patent Application No. 201920025071.5, filed on Jan. 8, 2019, each of which is hereby entirely incorporated by reference as a part of the present application.

TECHNICAL FIELD

The present disclosure relates to a display device.

BACKGROUND

In the display field, there is a structure in which a display module is fixedly mounted in a frame of a display device by a flat plate-shaped press sheet. Generally, the press sheet is provided on the back side of the frame and the back side of the display module, the press sheet and the frame are fixed together by a screw passing through the press sheet, and the display module is pressed into the frame by the press sheet. With this fixing structure, the display module and the frame are fixed by controlling a tightening force of the screw. Because the press sheet is flat plate-shaped and does not have a circumferential positioning structure, the press sheet and the screw form a lever effect when the screw is tightened, resulting in local deformation of the frame along a Z axis (which is a direction perpendicular to a display surface of the display module), so that defects such as uneven GAP (gap) and light leakage occur. In addition, a defect that the display module rotates and moves in an X-axis direction and a Y-axis direction (which are directions parallel to the display surface of the display module) further occurs, which affects the picture quality of the whole display device.

SUMMARY

According to the embodiments of the disclosure, a display device is provided. The display device comprises a frame, a display module is provided in the frame, the frame is provided with a plurality of press sheets for fixing the display module, the plurality of press sheets are provided around the display module, and each press sheet is provided with a circumferential positioning part which limits a position of the press sheet in a direction parallel to a display surface of the display module.

For example, the plurality of press sheets are provided on a back surface of the display module, and the display surface and the back surface of the display module are provided on opposite sides of the display module, respectively.

For example, the circumferential positioning part circumferentially positions and matches the display module to limit a position of the display module in the direction parallel to the display surface of the display module.

For example, the circumferential positioning part comprises a first positioning hole or a first positioning protrusion provided on the press sheet, and the back surface of the display module is correspondingly provided with the first positioning protrusion or the first positioning hole matched with the circumferential positioning part.

For example, the circumferential positioning part comprises a protrusion provided on the press sheet; in a direction perpendicular to the display surface of the display module, the protrusion protrudes from the press sheet toward the display module; and the protrusion has a positioning surface, the positioning surface circumferentially positions and matches a side surface of the display module, and the side surface of the display module is between the display surface and the back surface and intersects the display surface and the back surface.

For example, the press sheet comprises a first plate and a second plate integrally connected with the first plate, the second plate is the protrusion, and the first plate is perpendicular to the second plate.

For example, the second plate is provided on the press sheet by punching.

For example, the positioning surface of the protrusion and the side surface of the display module face each other and contact each other.

For example, the press sheet comprises a mounting and positioning part, the mounting and positioning part comprises a second positioning hole or a second positioning protrusion provided on the press sheet, and the frame is correspondingly provided with the second positioning protrusion or the second positioning hole matched with the press sheet.

For example, the circumferential positioning part circumferentially positions and matches the frame.

For example, the circumferential positioning part is a mounting and positioning part, the mounting and positioning part comprises a second positioning hole or a second positioning protrusion provided on the press sheet, and the frame is correspondingly provided with the second positioning protrusion or the second positioning hole matched with the mounting and positioning part.

For example, the press sheet is provided with a first through hole, a screw screwed with the frame is inserted into the first through hole, and the screw is screwed into a screw hole of the frame.

For example, the press sheet is in a shape of a rounded rectangle, the circumferential positioning part is the mounting and positioning part, the mounting and positioning part and the first through hole are arranged along a long side direction of the press sheet, or the mounting and positioning part and the first through hole are arranged along a short side direction of the press sheet.

For example, the frame is provided with at least two steps, the display module is provided on a supporting surface of a first step among the at least two steps, one end of the press sheet is provided on a supporting surface of a second step among the at least two steps, the other end of the press sheet is provided on a back surface of the display module, and a gap is provided between the second step and a side surface of the display module.

For example, the circumferential positioning part comprises a protrusion provided on the press sheet, the protrusion is provided in the gap.

For example, the gap is set such that a width of a portion, close to the press sheet, of the gap is larger than a width of another portion, away from the press sheet, of the gap.

For example, the supporting surface of the second step and the back surface of the display module are in a same plane.

For example, the frame comprises a protrusion protruding in a direction away from the display module, and the protrusion is perpendicular to the display surface of the display module.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

FIG. 10 is another sectional view taken along line A-A of FIG. 1.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that the embodiments in this disclosure and the features in the embodiments can be combined with each other without conflict.

Figure 1:
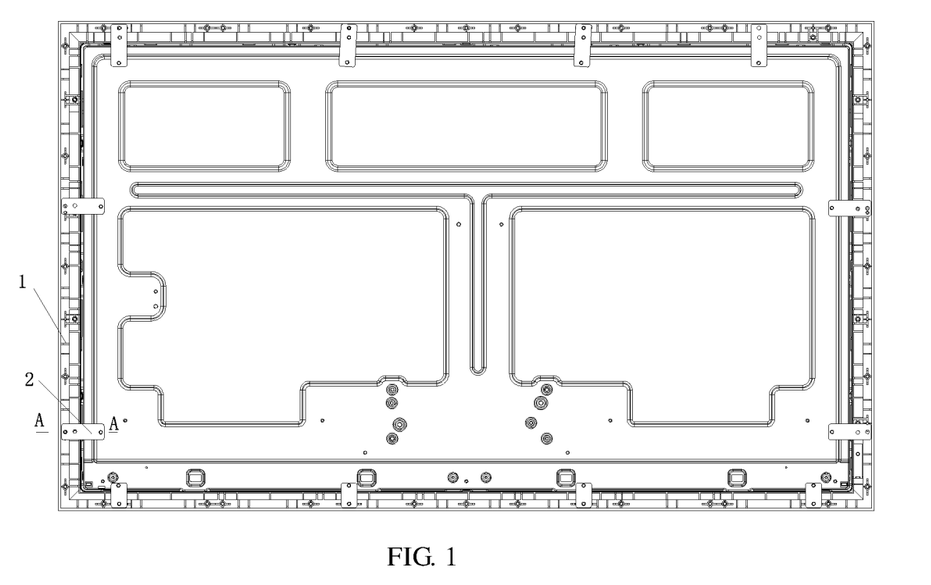
FIG. 1 is a rear view of a display device provided by embodiments of the present disclosure.
Figure 2:
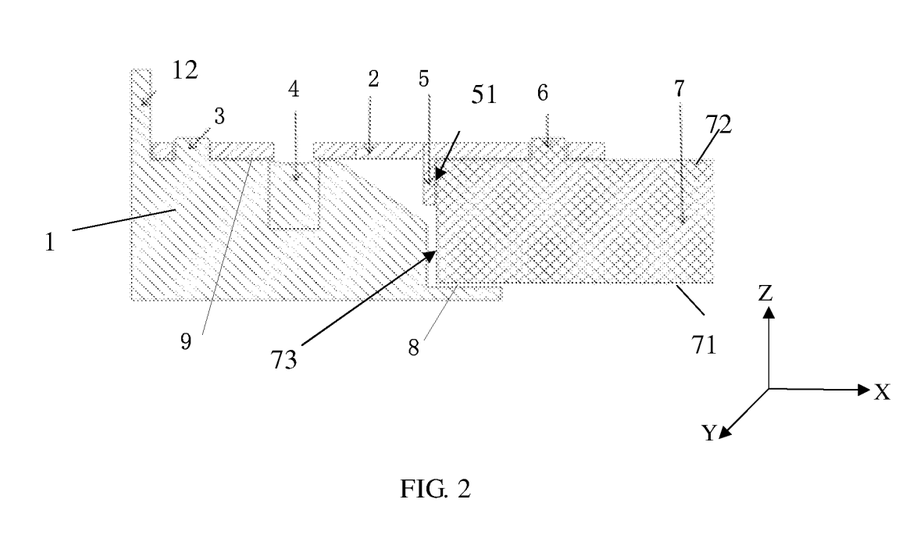
FIG. 2 is a sectional view taken along line A-A of FIG. 1.
Figure 3:
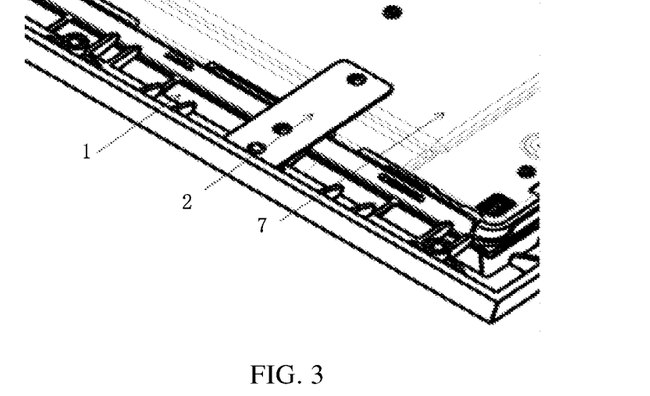
FIG. 3 is a partial perspective enlarged view of the display device provided by the embodiments of the present disclosure.

As shown in FIGS. 1-3, the display device provided by the embodiments of the present disclosure includes a frame 1, a display module 7 is provided in the frame 1, a plurality of press sheets 2 for fixing the display module 7 are provided on the frame 1, the plurality of press sheets 2 are provided around the display module 7, and each press sheet 2 is provided with a circumferential positioning part which limits a position of the press sheet 2 in a direction parallel to a display surface 71 of the display module 7.

The display device is, for example but not limited to, a picture screen, a television, or a computer monitor.

The frame 1 is, for example but not limited to, an injection molded rectangular frame; and according to display requirements, the frame 1 may be a frame with other structure, such as a round frame, an oval frame and the like, formed by other materials.

The frame 1 has a mounting groove inside which the display module 7 is placed. For example, the plurality of press sheets 2 are fixedly connected to the frame 1 by screws or fasteners (hereinafter, the embodiments of the present disclosure are explained by taking the screws as an example); the plurality of press sheets 2 are provided around the display module 7, that is, a circle of press sheets 2 is provided to surround the display module 7; and the plurality of press sheets 2 are spaced from each other. For example, the plurality of press sheets 2 are located on a back surface 72 of the display module 7, and the display surface 71 of the display module 7 and the back surface 72 of the display module 7 are located on opposite sides of the display module 7, respectively. Each press sheet 2 is provided with the circumferential positioning part; "circumferential" and "circumferentially" here are related with the direction parallel to the display surface 71 of the display module 7; and the position of the press sheet 2 in the direction parallel to the display surface 71 of the display module 7 is limited by the circumferential positioning part. If expressed in a spatial rectangular coordinate system, the display surface 71 of the display module 7 is in a plane where an X axis and a Y axis are located, and a direction perpendicular to the display surface 71 is a Z axis.

In the embodiments of the present disclosure, because the press sheet 2 is provided with the circumferential positioning part, the press sheet 2 no longer has the phenomenon of lever effect, and the defects such as uneven GAP and light leakage caused by local deformation of the frame 1 along the Z axis are eliminated. Therefore, the picture quality of the display device is improved.

For example, the circumferential positioning part circumferentially positions and matches the display module 7 to limit a position of the display module 7 in the direction parallel to the display surface 71 of the display module 7. That is, the circumferential positioning part not only limits the position of the press sheet 2, but also limits the position of the display module 7; and in this case, the press sheet 2 and the display module 7 are fixed with each other. The circumferential positioning part circumferentially positions and matches the display module 7, that is, by the circumferential positioning and matching between the circumferential positioning part and the display module 7, the limiting of the position of the display module 7 in the plane where the X axis and Y axis are located is realized, so that the display module 7 does not move or rotate in the plane where the X axis and Y axis are located. Because the circumferential positioning part limits the position of the display module 7 in the direction parallel to the display surface 71 of the display module 7, the display module 7 is prevented from moving or rotating in the plane where the X axis and the Y axis are located, and the picture quality of the display device is further improved.

In the case that the circumferential positioning part circumferentially positions and matches the display module 7 to limit the position of the display module 7 in the direction parallel to the display surface 71 of the display module 7, for example, the circumferential positioning part includes a first positioning hole provided in the press sheet 2 and the back surface 72 of the display module 7 is correspondingly provided with a first positioning protrusion matched with the first positioning hole, or the circumferential positioning part includes the first positioning protrusion provided on the press sheet 2 and the back surface 72 of the display module 7 is correspondingly provided with the first positioning hole matched with the first positioning protrusion.

Referring to FIG. 1-FIG. 6, in the case that the first positioning hole 13 is provided in the press sheet 2, the back surface 72 of the display module 7 is provided with the first positioning protrusion 6 which is inserted into and matched with the first positioning hole 13, so as to realize circumferentially positioning and matching between the circumferential positioning part and the display module 7, and to limit the movement and rotation of the display module 7 in the plane where the X axis and Y axis are located (that is, the plane parallel to the display surface 71 of the display module 7). In addition, through the insertion-type cooperation between the first positioning hole 13 and the first positioning protrusion 6, the rotation of the press sheet 2 along with the rotation of the screw for fixedly connecting the press sheet 2 to the frame 1 is avoided in an assembly process, thus optimizing the assembly process, improving assembly efficiency and reducing assembly costs.

For example, in the case that the press sheet 2 is provided with the first positioning protrusion 6, the back surface 72 of the display module 7 is provided with the first positioning hole 13, and the first positioning protrusion 6 is inserted into and matched with the first positioning hole 13.

In the case that the circumferential positioning part circumferentially positions and matches the display module 7 to limit the position of the display module 7 in the direction parallel to the display surface 71 of the display module 7, for example, the circumferential positioning part includes a protrusion 5 provided on the press sheet 2, the protrusion 5 has a positioning surface 51, and the positioning surface 51 circumferentially positions and matches a side surface 73 of the display module 7. The side surface 73 of the display module 7 is located between the display surface 71 and the back surface 72 and intersects the display surface 71 and the back surface 72. For example, in the direction perpendicular to the display surface 71 of the display module 7, the protrusion 5 protrudes from the press sheet 2 toward the display module 7. For example, the positioning surface 51 of the protrusion 5 and the side surface 73 of the display module 7 face each other. For example, the positioning surface 51 of the protrusion 5 and the side surface 73 of the display module 7 contact each other.

Figure 7:
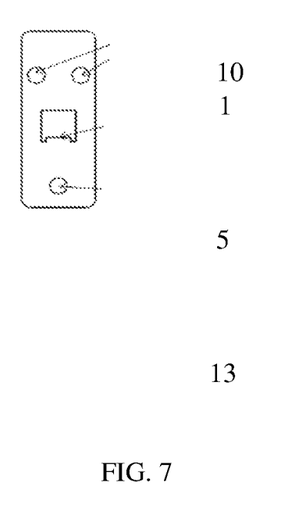
FIG. 7 is another front view of the press sheet provided by the embodiments of the present disclosure.
Figure 8:
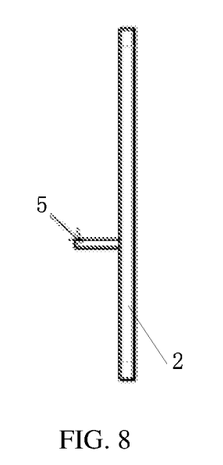
FIG. 8 is a side view of the press sheet shown in FIG. 7.
Figure 9:
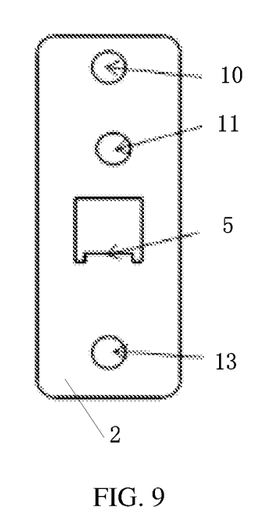
FIG. 9 is still another front view of the press sheet provided by the embodiments of the present disclosure.

For example, the circumferential positioning part only includes the first positioning hole 13 or the first positioning protrusion 6, or the circumferential positioning part only includes the protrusion 5 provided on the press sheet 2. For example, according to the embodiments of the present disclosure, the protrusion 5 is provided and the first positioning hole 13 or the first positioning protrusion 6 is also provided. Referring to FIGS. 7 to 9, it is shown that the protrusion 5 and the first positioning hole 13 are provided at the same time.

The protrusion 5, in addition to realizing the circumferential positioning and matching of the display module 7 and limiting the movement and rotation of the display module in the plane where the X-axis and Y-axis are located (that is, the plane parallel to the display surface of the display module 7), supports the display module 7 to a certain extent in the case that the display device is in an upright state, so as to prevent that the display module excessively presses the frame 1 and thus local deformation of the frame 1 occurs. For example, referring to FIG. 1, in the case that the display device is in the upright state, the protrusion 5 of the press sheet 2 located at the bottom of the frame 1 supports the display module 7 to a certain extent.

For example, the press sheet 2 includes a first plate, the first plate is integrally connected with a second plate, the second plate is the protrusion 5, and the first plate is perpendicular to the second plate.

The press sheet 2 adopting the above structure has the advantages of simple structure, convenient manufacture and cost saving.

For example, the press sheet 2 is made of metal sheet. In the case that the metal sheet is used, the second plate is for example provided on the press sheet by punching. For example, the first plate and the second plate are integrally formed by injection molding.

For example, the protrusion 5 is formed by a part of the press sheet 2; in this case, the press sheet 2 is cut to partially separate a part from the press sheet 2; a first side, a second side and a third side of the part are separated from the press sheet 2, and only a fourth side of the part is connected with the press sheet 2, and then the part is bent along the fourth side to obtain the protrusion 5.

For example, the press sheet 2 is provided with a first through hole 11, and a screw screwed with the frame 1 is inserted into the first through hole 11. The screw is screwed into a screw hole 4 of the frame 1 to realize the fixed connection between the press sheet 2 and the frame 1.

For example, the press sheet 2 is provided with a mounting and positioning part, the mounting and positioning part includes a second positioning hole provided in the press sheet 2 and the frame 1 is correspondingly provided with a second positioning protrusion matched with the second positioning hole of the mounting and positioning part, or the mounting and positioning part includes the second positioning protrusion provided on the press sheet 2 and the frame 1 is correspondingly provided with the second positioning hole matched with the second positioning protrusion of the mounting and positioning part.

For example, in the case that the press sheet 2 is provided with the second positioning hole 10, the frame 1 is provided with the second positioning protrusion 3 which is inserted into and matched with the second positioning hole 10; by inserting the second positioning protrusion 3 into the second positioning hole 10, the press sheet 2 is prevented from rotating with the rotation of the screw in the assembly process, which optimizes the assembly process, improves the assembly efficiency and reduces the assembly cost.

For example, in the case that the press sheet 2 is provided with the second positioning protrusion 3, the frame 1 is provided with the second positioning hole 10 which is inserted by and matched with the second positioning protrusion 3.

Figure 4:
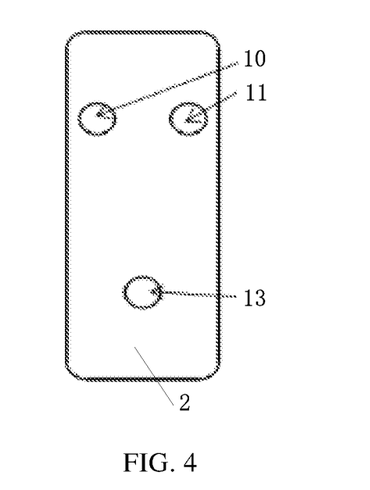
FIG. 4 is a front view of a press sheet provided by the embodiments of the present disclosure.
Figure 5:
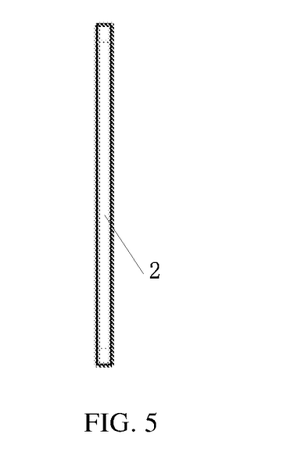
FIG. 5 is a side view of the press sheet shown in FIG. 4.
Figure 6:
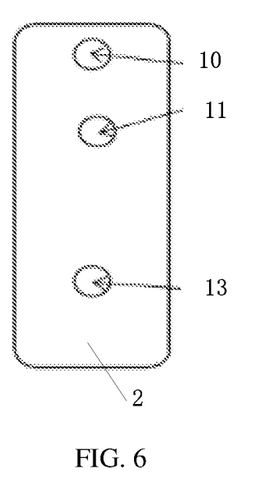
FIG. 6 is another front view of the press sheet provided by the embodiments of the present disclosure.

For example, the press sheet 2 is in a shape of a rounded rectangle, and the rounded rectangle here means that the four corners of the rectangle are rounded. As shown in FIG. 4, the mounting and positioning part (taking the second positioning hole 10 as an example) and the first through hole 11 are arranged along a transverse direction of the press sheet 2, that is, the mounting and positioning part and the first through hole 11 are arranged along a short side direction of the press sheet 2. Or, as shown in FIG. 6, the mounting and positioning part and the first through hole 11 are arranged along a longitudinal direction of the press sheet 2, that is, the mounting and positioning part and the first through hole 11 are arranged along a long side direction of the press sheet 2.

For example, the circumferential positioning part circumferentially positions and matches the frame 1; in this case, for example, the mounting and positioning part serves as the circumferential positioning part.

For example, referring to FIG. 2, the frame 1 is provided with at least two steps, the display module 7 is provided on a supporting surface 8 of a first step, one end of the press sheet 2 is provided on a supporting surface 9 of a second step, the other end of the press sheet 2 is provided on the back surface 72 of the display module 7, and a gap is provided between the second step and the side surface 73 of the display module 7. For example, the protrusion 5 is located in the gap. In this structure, one end of the press sheet 2 is pressed against the supporting surface 9 of the second step, and the other end of the press sheet 2 is pressed against the back surface 72 of the display module 7. The gap is provided between the second step and the display module 7 to form a bridge structure, so that there is a certain margin after the press sheet 2 is mounted in place to prevent the display module 7 from being crushed.

The supporting surface mentioned here is the horizontal plane of each step as shown in FIG. 2.

For example, as shown in FIG. 2, the supporting surface 9 of the second step and the back surface 72 of the display module 7 are provided in a same plane, so that the press sheet 2 has a surface contact with each of the supporting surface 9 of the second step and the back surface 72 of the display module 7, which improves the mounting reliability, reduces the contact stress at contact positions, and prevents parts from being damaged due to excessive contact stress. Further, for example, as shown in FIG. 10, the supporting surface 9 of the second step and the back surface 72 of the display module 7 are provided in different planes.

For example, in order to conveniently provide the protrusion 5 in the gap between the second step and the side surface 73 of the display module 7, the gap is set so that a width of a portion, close to the press sheet 2, of the gap is larger than a width of another portion, away from the press sheet 2, of the gap.

For example, referring to FIG. 2, the frame 1 has a protrusion 12 protruding in a direction away from the display module 7, the protrusion 12 is perpendicular to the display surface 71 of the display module 7, and the protrusion 12 is configured to be clamped with a back cover of the display device.

What are described above are related to the illustrative embodiments of the disclosure only and not limitative to the scope of the disclosure; the scope of the disclosure is defined by the accompanying claims.

What is claimed is:

1. A display device, comprising a frame, wherein
a display module is provided in the frame, the frame is provided with a plurality of press sheets for fixing the display module, the plurality of press sheets are provided around the display module, and each press sheet is provided with a positioning part which limits a position of the press sheet in a direction parallel to a display surface of the display module,
the positioning part of each press sheet positions and matches the display module to limit a position of the display module in the direction parallel to the display surface of the display module,
the positioning part of each press sheet includes a first positioning hole provided in the press sheet and the back surface of the display module is correspondingly provided with a first positioning protrusion matched with the first positioning hole; or, the positioning part of each press sheet includes the first positioning protrusion provided on the press sheet and the back surface of the display module is correspondingly provided with the first positioning hole matched with the first positioning protrusion.

2. The display device according to claim 1, wherein the plurality of press sheets are provided on a back surface of the display module, and the display surface and the back surface of the display module are provided on opposite sides of the display module, respectively.

3. The display device according to claim 1, wherein
the positioning part of each press sheet comprises a protrusion provided on the press sheet;
in a direction perpendicular to the display surface of the display module, the protrusion protrudes from the press sheet toward the display module; and
the protrusion has a positioning surface, the positioning surface positions and matches a side surface of the display module, and the side surface of the display module is between the display surface and the back surface and intersects the display surface and the back surface.

4. The display device according to claim 3, wherein each press sheet comprises a first plate and a second plate integrally connected with the first plate, the second plate is the protrusion, and the first plate is perpendicular to the second plate.

5. The display device according to claim 3, wherein the positioning surface of the protrusion and the side surface of the display module face each other and contact each other.

6. The display device according to claim 1, wherein
each press sheet comprises a mounting and positioning part; and
the mounting and positioning part of each press sheet includes a second positioning hole provided in the press sheet and the frame is correspondingly provided with a second positioning protrusion matched with the second positioning hole of the mounting and positioning part, or, the mounting and positioning part of each press sheet includes the second positioning protrusion provided on the press sheet and the frame is correspondingly provided with the second positioning hole matched with the second positioning protrusion of the mounting and positioning part.

7. The display device according to claim 6, wherein
each press sheet is provided with a first through hole, a screw screwed with the frame is inserted into the first through hole, and the screw is screwed into a screw hole of the frame;
each press sheet is in a shape of a rounded rectangle; and
the mounting and positioning part and the first through hole of each press sheet are arranged along a long side direction of the each press sheet, or the mounting and positioning part and the first through hole of each press sheet are arranged along a short side direction of the each press sheet.

8. The display device according to claim 1, wherein the frame is provided with at least two steps, the display module is provided on a supporting surface of a first step among the at least two steps, one end of each press sheet is provided on a supporting surface of a second step among the at least two steps, the other end of each press sheet is provided on a back surface of the display module, and a gap is provided between the second step and a side surface of the display module.

9. The display device according to claim 8, wherein the positioning part of each press sheet comprises a protrusion provided on the press sheet, the protrusion is provided in the gap.

10. The display device according to claim 9, wherein the gap is set such that a width of a portion, close to each press sheet, of the gap is larger than a width of another portion, away from each press sheet, of the gap.

11. The display device according to claim 8, wherein the supporting surface of the second step and the back surface of the display module are in a same plane.

12. The display device according to claim 8, wherein the supporting surface of the second step and the back surface of the display module are in different planes.

13. The display device according to claim 1, wherein the frame comprises a protrusion protruding in a direction away from the display module, and the protrusion is perpendicular to the display surface of the display module.

14. A display device, comprising a frame, wherein
a display module is provided in the frame, the frame is provided with a plurality of press sheets for fixing the display module, the plurality of press sheets are provided around the display module, and each press sheet is provided with a positioning part which limits a position of the press sheet in a direction parallel to a display surface of the display module,
the positioning part of each press sheet positions and matches the frame,
the positioning part of each press sheet is a mounting and positioning part; and
the mounting and positioning part of each press sheet includes a second positioning hole provided in the press sheet and the frame is correspondingly provided with a second positioning protrusion matched with the second positioning hole of the mounting and positioning part, or, the mounting and positioning part of each press sheet includes the second positioning protrusion provided on the press sheet and the frame is correspondingly provided with the second positioning hole matched with the second positioning protrusion of the mounting and positioning part.

15. The display device according to claim 14, wherein
each press sheet is further provided with a first through hole, a screw screwed with the frame is inserted into the first through hole, and the screw is screwed into a screw hole of the frame;
each press sheet is in a shape of a rounded rectangle; and
the mounting and positioning part and the first through hole of each press sheet are arranged along a long side direction of the each press sheet, or the mounting and positioning part and the first through hole of each press sheet are arranged along a short side direction of the each press sheet.

16. The display device according to claim 14,
wherein the plurality of press sheets are provided on a back surface of the display module, and the display surface and the back surface of the display module are provided on opposite sides of the display module, respectively.

17. The display device according to claim 14, wherein
the positioning part of each press sheet comprises a protrusion provided on the press sheet;
in a direction perpendicular to the display surface of the display module, the protrusion protrudes from the press sheet toward the display module; and
the protrusion has a positioning surface, the positioning surface positions and matches a side surface of the display module, and the side surface of the display module is between the display surface and the back surface and intersects the display surface and the back surface.

18. The display device according to claim 17, wherein each press sheet comprises a first plate and a second plate integrally connected with the first plate, the second plate is the protrusion, and the first plate is perpendicular to the second plate.

19. The display device according to claim 17, wherein the positioning surface of the protrusion and the side surface of the display module face each other and contact each other.

* * * * *